(12) United States Patent
Kim et al.

(10) Patent No.: US 9,293,567 B2
(45) Date of Patent: Mar. 22, 2016

(54) LASER CRYSTALLIZATION APPARATUS AND METHOD

(71) Applicants: Sung-Ho Kim, Yongin (KR); Min-Hwan Choi, Yongin (KR)

(72) Inventors: Sung-Ho Kim, Yongin (KR); Min-Hwan Choi, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 463 days.

(21) Appl. No.: 13/828,242

(22) Filed: Mar. 14, 2013

(65) Prior Publication Data
US 2014/0017861 A1  Jan. 16, 2014

(30) Foreign Application Priority Data
Jul. 10, 2012 (KR) .................. 10-2012-0075268

(51) Int. Cl.
| | |
|---|---|
| C30B 1/04 | (2006.01) |
| H01L 29/66 | (2006.01) |
| H01L 21/02 | (2006.01) |
| H01L 27/12 | (2006.01) |
| B23K 26/06 | (2014.01) |
| B23K 26/08 | (2014.01) |

(52) U.S. Cl.
CPC ........ *H01L 29/6675* (2013.01); *B23K 26/0608* (2013.01); *B23K 26/083* (2013.01); *H01L 21/02002* (2013.01); *H01L 27/1285* (2013.01); *H01L 29/66757* (2013.01); *H01L 21/02532* (2013.01); *H01L 21/02675* (2013.01)

(58) Field of Classification Search
None
See application file for complete search history.

(56) References Cited

U.S. PATENT DOCUMENTS

| | | | |
|---|---|---|---|
| 5,930,606 A | 7/1999 | McCulloch | |
| 6,136,632 A | 10/2000 | Higashi | |
| 7,011,577 B2* | 3/2006 | Lee | F24F 3/1603 165/9.3 |
| 7,391,928 B2* | 6/2008 | Takayama et al. | H04N 1/40056 250/201.2 |
| 7,919,399 B2* | 4/2011 | Arai | H01L 27/1285 117/904 |
| 2007/0013791 A1* | 1/2007 | Kinoshita et al. | G01S 3/7864 348/239 |

FOREIGN PATENT DOCUMENTS

| | | |
|---|---|---|
| KR | 1998-701267 A | 5/1998 |
| KR | 10-2001-0039813 A | 5/2001 |
| KR | 10-2004-0106240 A | 12/2004 |

* cited by examiner

Primary Examiner — Robert M Kunemund
(74) Attorney, Agent, or Firm — Lee & Morse, P.C.

(57) ABSTRACT

A laser crystallization apparatus includes a laser generator that generates a laser beam, a stage mounted with an object substrate with an object thin film to which the laser beam is firstly incident, the stage is relatively movable such that the laser beam scans the object thin film for crystallization, and a reflection mirror that secondly reflects a second reflection laser beam to the object thin film from a first reflection laser beam that is reflected from the object thin film to the reflection mirror.

26 Claims, 7 Drawing Sheets

LASER CRYSTALLIZATION APPARATUS AND METHOD

CROSS-REFERENCE TO RELATED APPLICATION

This application claims priority under 35 U.S.C. §119 to Korean Patent Application No. 10-2012-0075268, filed in the Korean Intellectual Property Office on Jul. 10, 2012, the entire contents of which are incorporated herein by reference.

BACKGROUND

Amorphous silicon (a-Si) may have some disadvantageous such a low mobility of electrons (i.e., electric charge carriers) and a low aperture ratio. Further, amorphous silicon may not be suitable for a complementary metal-oxide-semiconductor (CMOS) process. A polycrystalline silicon (poly-Si) thin film element is available and may have some advantages over amorphous silicon.

SUMMARY

Embodiments may be realized by providing a laser crystallization apparatus that includes a laser generator generating a laser, a stage mounted with an object substrate formed with an object thin film to which the laser generated from the laser generator is firstly incident, and a reflection mirror secondly reflecting the first reflection laser reflected from the object thin film to the object thin film. The stage is relatively moved for the laser to scan the object thin film for crystallization.

An assistance incident path through which the first reflection laser is incident to the reflection mirror may be the same as an assistance reflection path of the second reflection laser reflected from the reflection mirror. A reflection angle of the first reflection laser reflected by the object thin film may be the same as an inclination angle of the reflection mirror, and an inclination angle of the reflection mirror may be an inclination angle of a horizontal surface of the reflection mirror with reference to the horizontal surface of the object thin film.

The assistance incident angle at which the first reflection laser is incident to the reflection mirror may be larger than zero degrees. The assistance incident angle may be the same as the assistance reflection angle of the second reflection laser reflected by the reflection mirror, and the reflection angle of the first reflection laser reflected by the object thin film may be larger than the inclination angle of the reflection mirror.

Embodiments may also be realized by providing a laser generator generating a laser, a stage mounted with an object substrate formed with an object thin film to which the laser generated from the laser generator is firstly incident, a reflection mirror reflecting a first reflection laser reflected by the object thin film, and a transflective mirror again secondly reflecting the second reflection laser reflected by the reflection mirror to the object thin film. The stage is relatively moved for the laser to scan the object thin film for crystallization.

A reflection angle of the first reflection laser reflected by the object thin film may be smaller than an inclination angle of the reflection mirror. The transflective mirror may be positioned at the first incident path through which the laser is firstly incident to the object thin film. A surface of the reflection mirror may have a concave mirror shape.

Embodiments may also be realized by providing a laser crystallization method that includes reflecting a laser generated from the laser generator to an object thin film mounted on a stage to firstly crystallize the object thin film, reflecting the first reflection laser reflected by the object thin film to the object thin film by using a reflection mirror positioned on the object thin film to secondly crystallize the object thin film, and moving the object thin film.

An assistance incident path through which the first reflection laser is incident to the reflection mirror may be the same as an assistance reflection path of the second reflection laser reflected from the reflection mirror, a reflection angle of the first reflection laser reflected by the object thin film may be the same as an inclination angle of the reflection mirror, and an inclination angle of the reflection mirror may be an inclination angle of a horizontal surface of the reflection mirror with reference to the horizontal surface of the object thin film.

The assistance incident angle at which the first reflection laser may be incident to the reflection mirror is larger than zero degrees, the assistance incident angle may be the same as the assistance reflection angle of the second reflection laser reflected by the reflection mirror, and the reflection angle of the first reflection laser reflected by the object thin film may be larger than the inclination angle of the reflection mirror.

The first crystallization region that is firstly crystallized in the object thin film may be different from a second crystallization region that is secondly crystallized, and the first crystallization region may be a thin film transistor region while the second crystallization region is a capacitor region or a resistor region.

Embodiments may also be realized by providing a laser crystallization method that includes reflecting a laser generated from the laser generator to an object thin film mounted on a stage to firstly crystallize the object thin film, reflecting the first reflection laser reflected by the object thin film to the transflective mirror by using a reflection mirror positioned on the object thin film, reflecting the second reflection laser reflected by the reflection mirror to the object thin film by using a transflective mirror to secondly crystallize the object thin film, and moving the object thin film.

A reflection angle of the first reflection laser reflected by the object thin film may be smaller than an inclination angle of the reflection mirror. The transflective mirror may be positioned at the first path through which the laser is firstly incident to the object thin film.

The first crystallization region that is firstly crystallized in the object thin film may be the same as the second crystallization region that is secondly crystallized. The first crystallization region that is firstly crystallized in the object thin film may be different from the second crystallization region that is secondly crystallized, and the first crystallization region may be a thin film transistor region and the second crystallization region may be a capacitor region or a resistor region.

BRIEF DESCRIPTION OF THE DRAWINGS

Features will become apparent to those of ordinary skill in the art by describing in detail exemplary embodiments with reference to the attached drawings in which.

DETAILED DESCRIPTION

Embodiments will be described more fully hereinafter with reference to the accompanying drawings, in which exemplary embodiments are shown. As those skilled in the art would realize, the described embodiments may be modified in various different ways, all without departing from the spirit or scope thereof.

Constituent elements having the same configurations in various exemplary embodiments are exemplarily described in a first exemplary embodiment using like reference numerals, and only different configurations from those in the first exemplary embodiment will be described in the other exemplary embodiments.

In addition, parts not related to the description are omitted for clear description of the embodiments, and like reference numerals designate like elements and similar constituent elements throughout the specification. Further, since sizes and thicknesses of constituent members shown in the accompanying drawings are arbitrarily given for better understanding and ease of description, embodiments not limited to the illustrated sizes and thicknesses.

Now, a laser crystallization apparatus according to the first exemplary embodiment will be described with reference to FIG. 1.

Figure 1:
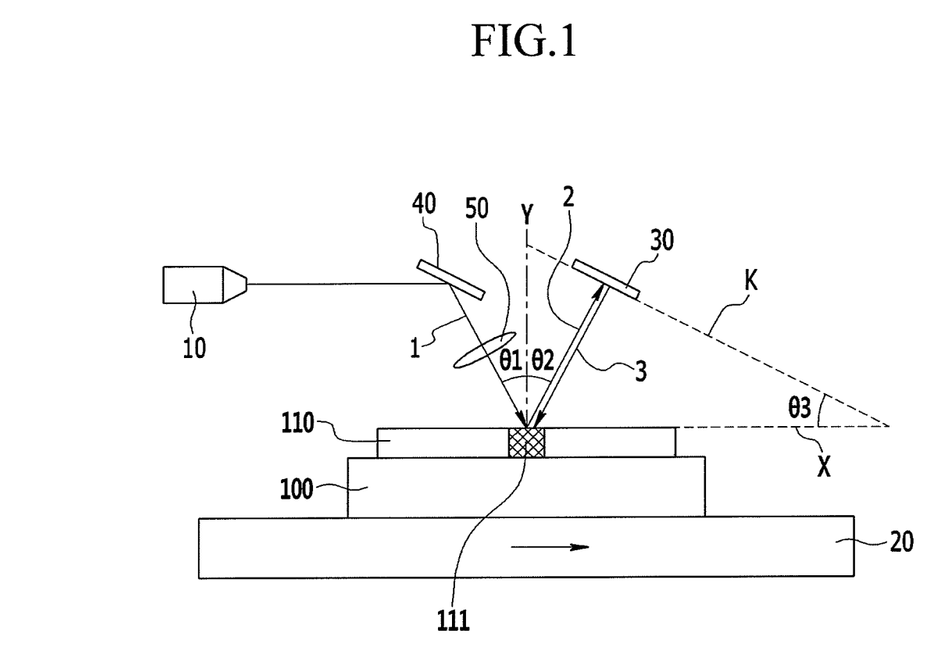
FIG. 1 is a schematic diagram of a laser crystallization apparatus according to an exemplary embodiment.

FIG. 1 is a schematic diagram of a laser crystallization apparatus according to the first exemplary embodiment.

As shown in FIG. 1, a laser crystallization apparatus includes a laser generator 10 generating a laser 1, a stage 20 mounted with an object substrate 100 thereon. The object substrate 100 has formed thereon an object thin film 110 on which the laser beam 1 generated from the laser generator 10 is firstly incident, i.e., the laser beam 1 is first directed toward the object thin film 110. A reflection mirror 30 is arranged so as to secondly reflect a first reflection laser beam 2, which corresponds to reflected portions of the laser beam 1. The reflection mirror 30 reflects the first reflection laser beam 2 received from the object thin film 110 back to the object thin film 110 as a second reflection laser beam 3.

The laser beam 1 generated from the laser generator 10 crystallizes the object thin film 110, e.g., as an excimer laser. The object thin film 110 may be an amorphous silicon thin film 110. The object thin film 110 may be formed through low pressure chemical vapor deposition, atmospheric pressure chemical vapor deposition, plasma enhanced chemical vapor deposition (PECVD), sputtering, vacuum evaporation, and the like.

The stage 20 relatively moves for the laser beam 1 that is first incident to the object thin film 110 to scan the entire region of the object thin film 110.

Between the laser generator 10 and the object thin film 110, an incident mirror 40 converting a direction for the laser beam 1 to be firstly incident to the object thin film 110 and a light collection lens 50 connecting the laser beam 1 reflected from the incident mirror 40 to be firstly incident to a predetermined region of the object thin film 110 are formed.

An incident angle θ1 of the laser beam 1 firstly incident to the object thin film 110 and a reflection angle θ2 of the first reflection laser beam 2 may be the same, and an assistance incident path through which the first reflection laser beam 2 is incident to the reflection mirror 30 and an assistance reflection path of the second reflection laser beam 3 reflected from the reflection mirror 30 may be the same. For example, the incident angle θ1 is the inclination angle of the laser beam 1 with reference to a vertical axis Y that is perpendicular to a horizontal surface X of the object thin film 110, and the reflection angle θ2 is defined by the inclination angle of the first reflection laser beam 2 with reference to the vertical axis Y.

At this time, the reflection angle θ2 of the first reflection laser beam 2 reflected from the object thin film 110 may be the same as the inclination angle θ3 of the reflection mirror 30. Here, the inclination angle θ3 of the reflection mirror 30 is defined by the inclination angle of the horizontal surface (K) of the reflection mirror 30 with reference to the horizontal surface X of the object thin film 110.

As described, the object thin film 110 is firstly crystallized by the laser beam firstly incident to the object thin film 110, and the object thin film 110 is secondly and additionally crystallized by the second reflection laser beam 3 reflected from the reflection mirror 30 and secondly incident to the object thin film 110 such that a crystallization region 111 of the object thin film 110 may be formed with the first crystallization and the second crystallization. Accordingly, a crystallization degree of the crystallization region 111 may be improved and a tack time of the laser crystallization may be decreased, thereby improving productivity of the laser crystallization.

A laser crystallization method using the laser crystallization apparatus according to the first exemplary embodiment will be described with reference to FIG. 1 and FIG. 2.

Figure 2:
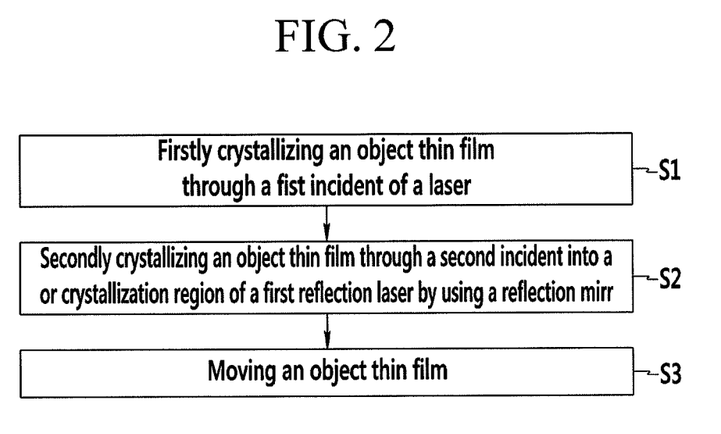
FIG. 2 is a flowchart of a laser crystallization method according to an exemplary embodiment.

FIG. 2 is a flowchart of a laser crystallization method according to the first exemplary embodiment.

As shown in FIG. 2, in the laser crystallization method according to the first exemplary embodiment, a laser beam 1 generated from a laser generator 10 is firstly incident to an object thin film 110 mounted on the stage 20 for the first crystallization of the crystallization region 111 of the object thin film 110 (operation S1).

Next, by using the reflection mirror 30 positioned on the object thin film 110, the first reflection laser beam 2 reflected by the object thin film 110 is secondly incident to the object thin film 110 for the second crystallization of the crystallization region 111 of the object thin film 110 (operation S2). At this time, the reflection angle θ2 of the first reflection laser beam 2 reflected from the object thin film 110 may be the same as the inclination angle θ3 of the reflection mirror 30, and the assistance incident path through which the first reflection laser beam 2 is incident to the reflection mirror 30 may be the same as the assistance reflection path of the second reflection laser beam 3 reflected from the reflection mirror 30. Accordingly, the first crystallization and the second crystallization are repeatedly performed for the same region of the object thin film 110 such that the crystallization degree of the crystallization region 111 and the productivity of the crystallization may be improved.

Next, the stage 20 is moved to move the object thin film 110 irradiated with the laser beam 1 (operation S3). Accordingly, by changing the position of the crystallization region 111, the crystallization region 111 may be formed at the selected position of the object thin film 110.

The surface of the reflection mirror in the first exemplary embodiment may be flat; however, embodiments are not limited thereto. For example, the surface of the reflection mirror may be concave as in the second exemplary embodiment.

Next, referring to FIG. 3, a laser crystallization apparatus according to the second exemplary embodiment will be described.

Figure 3:
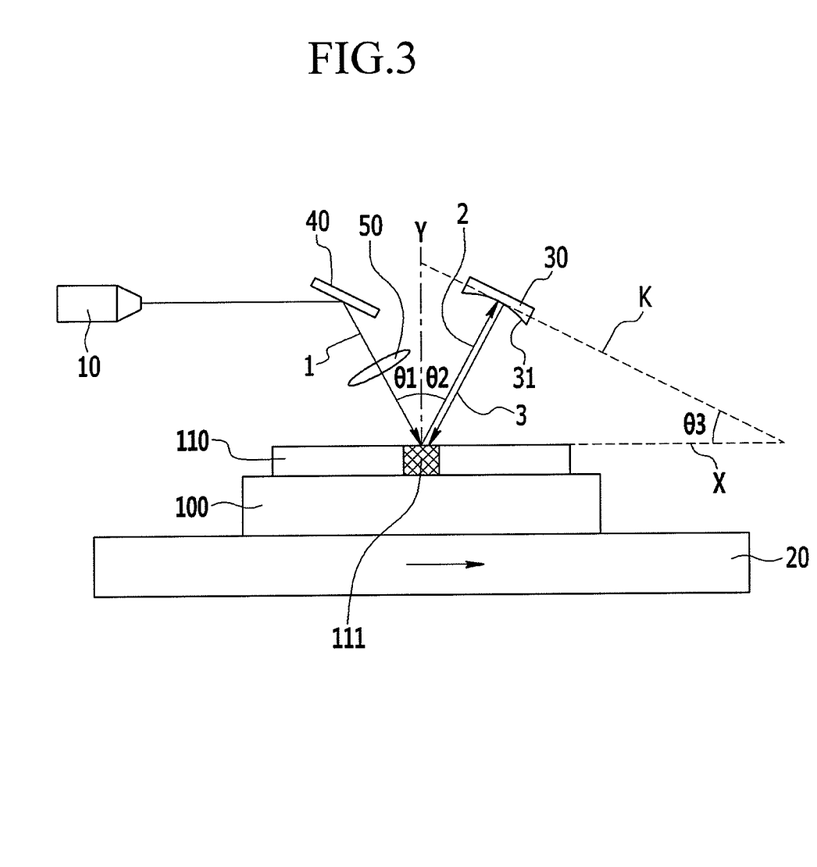
FIG. 3 is a schematic diagram of a laser crystallization apparatus according to an exemplary embodiment.

FIG. 3 is a schematic diagram of a laser crystallization apparatus according to the second exemplary embodiment. The second exemplary embodiment is substantially the same as the first exemplary embodiment shown in FIG. 1, except for the surface 31 of the reflection mirror such that the repeated description is omitted.

As shown in FIG. 3, the surface 31 of the reflection mirror 30 of the laser crystallization apparatus according to the second exemplary embodiment may be concave, e.g., concave in a direction facing the object thin film 110. The surface of the object thin film 110 may not be uniformly formed such that the first reflection laser beam 2 may be diffused or diffused and reflected. In this case, the reflection angle θ2 of the first reflection laser beam 2 is increased such that the surface 31 of the reflection mirror 30 may be concave so that the second incident angle is focused on the same crystallization region 111 of the object thin film 110 as the laser beam 1.

That is, as described, the surface 31 of the reflection mirror 30 is formed to be concave such that the diffused and reflected first reflection laser beam 2 may be collected and may be secondly incident to the same crystallization region 111 of the object thin film 110, thereby improving the crystallization degree and the productivity of the crystallization.

In the first exemplary embodiment, the assistance incident path through which the first reflection laser beam 2 is incident to the reflection mirror 30 is the same as the assistance reflection path of the second reflection laser beam 3 reflected from the reflection mirror 30, however the assistance incident path of the first reflection laser beam 2 and the assistance reflection path of the second reflection laser beam 3 may be different in the second exemplary embodiment.

Next, referring to FIG. 4, a laser crystallization apparatus according to the third exemplary embodiment will be described.

Figure 4:
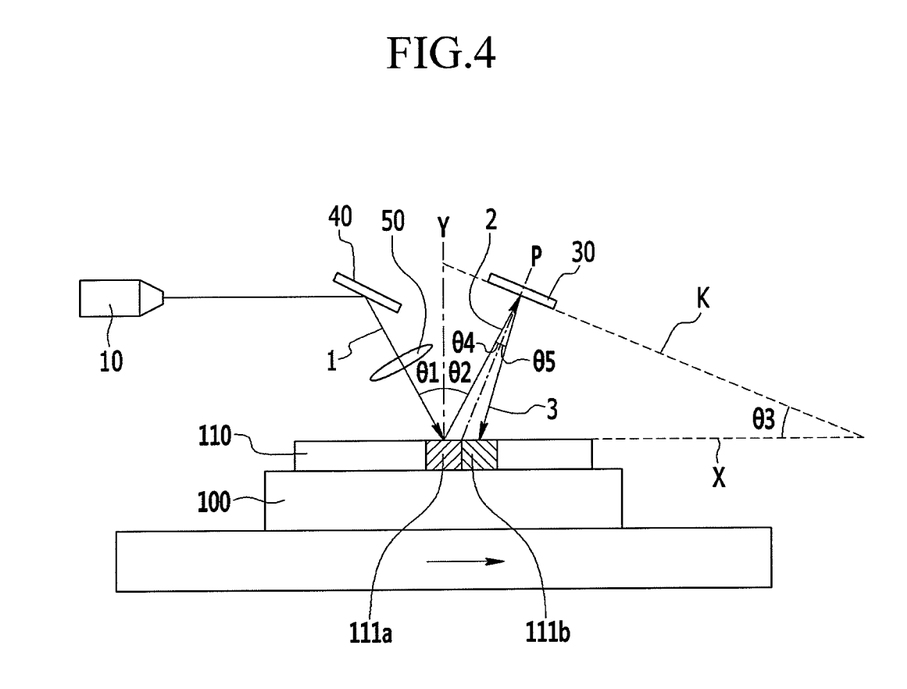
FIG. 4 is a schematic diagram of a laser crystallization apparatus according to an exemplary embodiment.

FIG. 4 is a schematic diagram of a laser crystallization apparatus according to the third exemplary embodiment.

The third exemplary embodiment is substantially equivalent to the first exemplary embodiment of FIG. 1, except for the inclination angle of the reflection mirror 30 such that the repeated description is omitted.

As shown in FIG. 4, in the laser crystallization apparatus according to the third exemplary embodiment, the assistance incident angle θ4 at which the first reflection laser beam 2 is incident to the reflection mirror 30 may be larger than zero degrees. At this time, the assistance incident angle θ4 may be the same as the assistance reflection angle θ5 of the second reflection laser beam 3 reflected from the reflection mirror 30, and the reflection angle θ2 of the first reflection laser beam 2 reflected from the object thin film 110 may be larger than the inclination angle θ3 of the reflection mirror 30. The assistance incident angle θ4 is the inclination angle of the first reflection laser beam 2 with reference to the vertical axis (P), which is perpendicular to the horizontal surface (K) of the reflection mirror 30, and the assistance reflection angle θ5 is defined by the inclination angle of the second reflection laser beam 3 with reference to the vertical axis (P).

Accordingly, the crystallization is realized by the direct first incident laser beam 1 from the laser generator 10 and the crystallization is realized by the second reflection laser beam 3 reflected from the reflection mirror 30 such that a first crystallization region 111a having high crystallization uniformity and a second crystallization region 111b having low crystallization uniformity are separated. Accordingly, the first crystallization region 111a may be formed at the thin film transistor region requiring high crystallization uniformity, and the second crystallization region 111b may be formed at a capacitor region or a resistor region where the crystallization uniformity is somewhat low.

Also, the first crystallization region 111a and the second crystallization region 111b are different such that the laser crystallization region may be expanded even though a line width of the laser is short.

Next, the laser crystallization method of the laser crystallization apparatus according to the third exemplary embodiment will be described with reference to FIG. 4 and FIG. 5.

Figure 5:
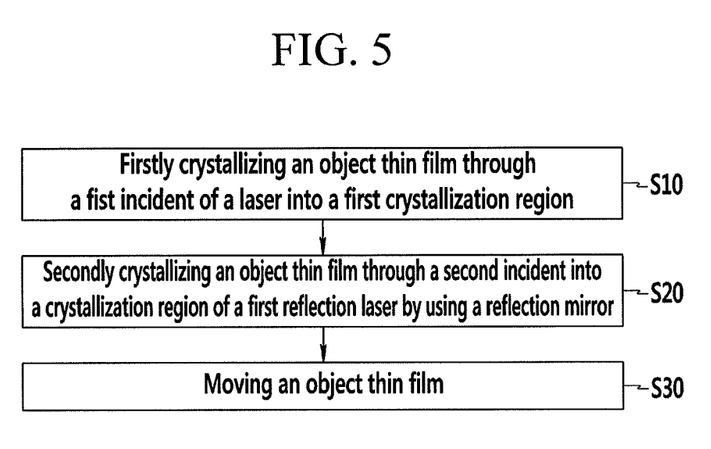
FIG. 5 is a flowchart of a laser crystallization method according to an exemplary embodiment.

FIG. 5 is a flowchart of a laser crystallization method according to the third exemplary embodiment.

As shown in FIG. 5, in the laser crystallization method according to the third exemplary embodiment, a laser beam 1 generated from a laser generator 10 is firstly incident to the first crystallization region 111a of the object thin film 110 mounted on the stage 20 for the first crystallization of the object thin film 110 (operation S10).

Next, by using the reflection mirror 30 positioned on the object thin film 110, the first reflection laser beam 2 reflected by the object thin film 110 is secondly incident to the second crystallization region 111b of the object thin film 110 for the second crystallization of the object thin film 110 (operation S20). At this time, the reflection angle θ2 of the first reflection laser beam 2 reflected from the object thin film 110 may be the same as the inclination angle θ3 of the reflection mirror 30, and the assistance incident angle θ4 at which the first reflection laser beam 2 is incident to the reflection mirror 30 may be larger than zero degrees. The assistance incident angle θ4 is the same as the assistance reflection angle θ5 of the second reflection laser beam 3 reflected by the reflection mirror 30, and the reflection angle of the first reflection laser beam 2 reflected from the object thin film 110 may be larger than the inclination angle θ3 of the reflection mirror 30.

Accordingly, the first crystallization region 111a having the high crystallization uniformity and the second crystallization region 111b having the low crystallization uniformity are separated and simultaneously formed such that the productivity of the laser crystallization process may be improved. That is, the first crystallization region 111a is formed at the thin film transistor region requiring high crystallization uniformity and the second crystallization region 111b is formed at the capacitor region or the resistor region not requiring high crystallization uniformity such that the productivity of the laser crystallization process may be improved.

Next, the stage 20 is moved to move the object thin film 110 irradiated with the laser beam 1 (operation S30). Accordingly, by changing the position of the first crystallization region 111a and the second crystallization region 111b, the first crystallization region 111a and the second crystallization region 111b may be formed at the selected positions of the object thin film 110.

Figure 6:
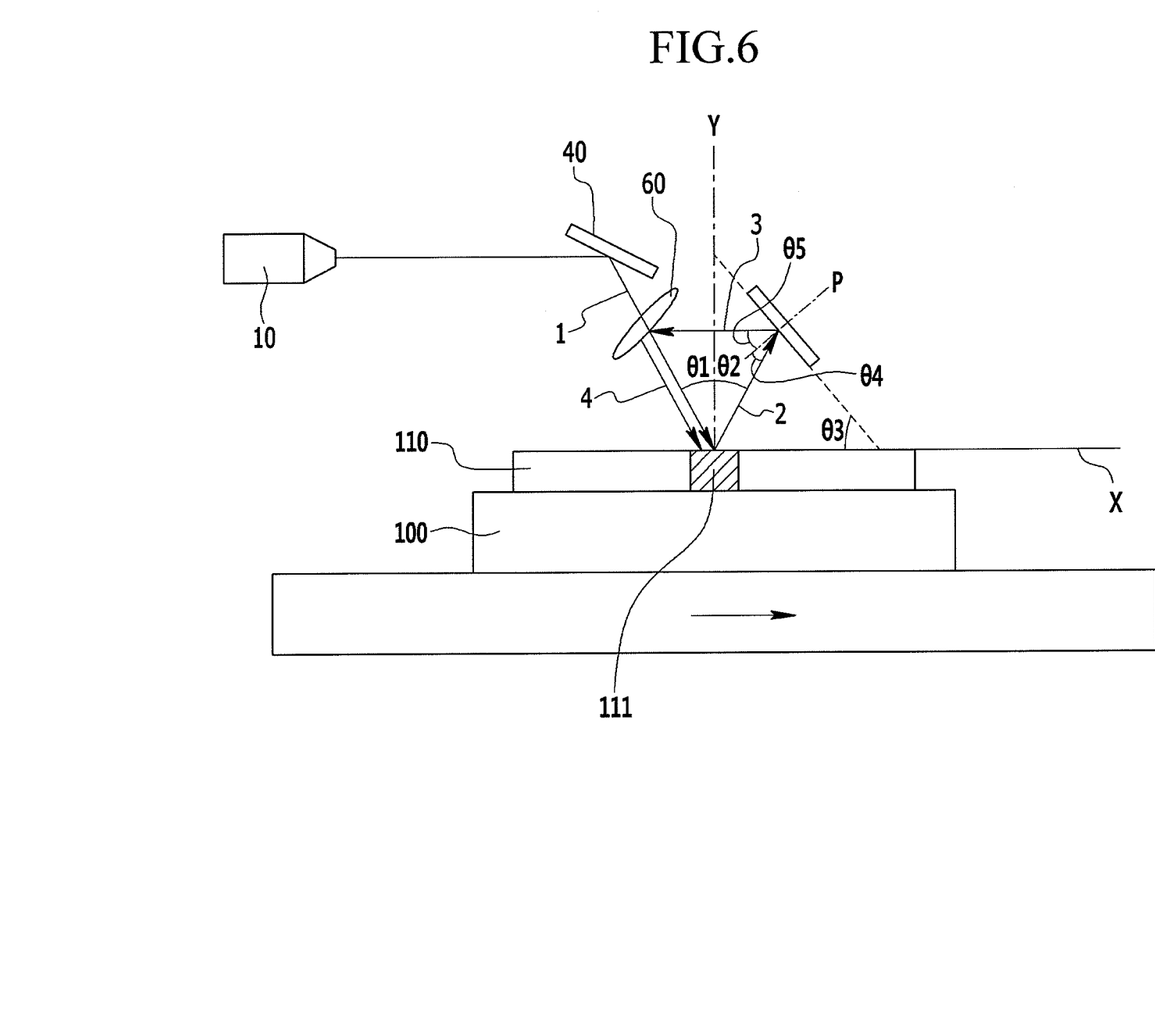
FIG. 6 is a schematic diagram of a laser crystallization apparatus according to an exemplary embodiment.

In the first exemplary embodiment, the assistance incident path through which the first reflection laser beam 2 is incident to the reflection mirror 30 is the same as the assistance reflection path of the second reflection laser beam 3 reflected from the reflection mirror 30. However, the fourth exemplary embodiment in which the third reflection laser beam 3 reflected from the transflective mirror is secondly incident to the object thin film 110 by using an additional transflective mirror may be provided.

Next, referring to FIG. 6, a laser crystallization apparatus according to the fourth exemplary embodiment will be described.

FIG. 6 is a schematic diagram of a laser crystallization apparatus according to the fourth exemplary embodiment.

The fourth exemplary embodiment is substantially equivalent to the first exemplary embodiment shown in FIG. 1, except for using the transflective mirror such that the repeated description is omitted.

As shown in FIG. 6 a laser crystallization apparatus according to the fourth exemplary embodiment includes a laser generator 10 generating a laser beam 1, a stage 20 mounted with an object substrate 100 formed with a object thin film 110 thereon (the laser beam 1 generated from the laser generator 10 is firstly incident on the object thin film 110), a reflection mirror 30 reflecting the first reflection laser beam 2 reflected from the object thin film 110, and a transflective mirror 60 secondly reflecting the second reflection laser beam 3 reflected from the reflection mirror 30 to the object thin film 110.

Between the laser generator 10 and the transflective mirror 60, may be an incident mirror 40 converting the direction for the laser beam 1 to be firstly incident to the object thin film 110.

The reflection angle θ2 of the first reflection laser beam 2 reflected from the object thin film 110 may be smaller than the inclination angle θ3 of the reflection mirror 30. Accordingly, the second reflection laser beam 3 reflected from the reflection mirror 30 is not incident to the object thin film 110, but is incident to the transflective mirror 60.

The transflective mirror 60 is positioned along the first incident path through which the laser beam 1 is firstly incident to the object thin film 110, and the transflective mirror 60 transmits the laser beam 1 that is incident to the front side and reflects the second reflection laser beam 3 that is incident to the rear side. The third reflection laser beam 4 reflected from the transflective mirror 60 is secondly incident to the object thin film 110 for the second crystallization of the object thin film 110.

Accordingly, the first crystallization of the object thin film 110 is realized by the first incident laser beam 1 to the object thin film 110 and the second crystallization of the object thin film 110 is additional realized by the third reflection laser beam 4 that is reflected by the reflection mirror 30 and the transflective mirror 60 and is secondly incident to the object thin film 110 such that the first crystallization and the second crystallization may be performed for the crystallization region 111 of the object thin film 110. Accordingly, the crystallization degree may be improved, and the productivity of the crystallization may be improved.

The laser crystallization method of the laser crystallization apparatus according to the fourth exemplary embodiment will be described with reference to FIG. 6 and FIG. 7.

Figure 7:
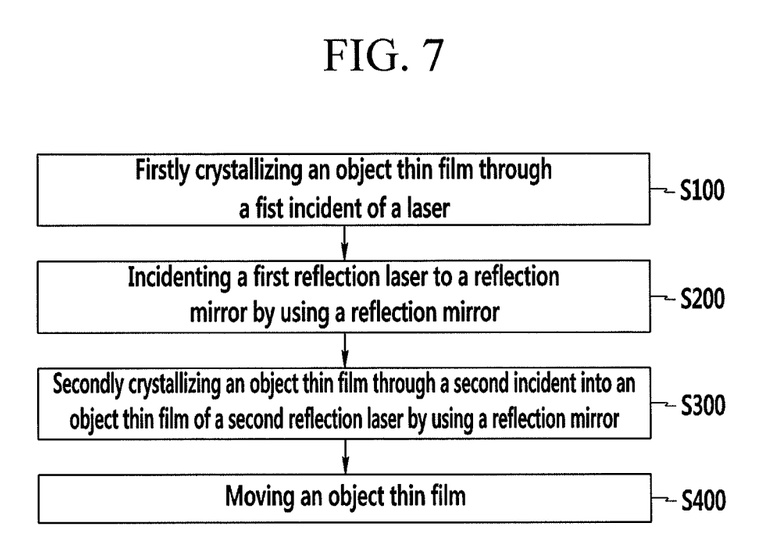
FIG. 7 is a flowchart of a laser crystallization method according to an exemplary embodiment.

FIG. 7 is a flowchart of a laser crystallization method according to the fourth exemplary embodiment.

As shown in FIG. 7, in the laser crystallization method according to the fourth exemplary embodiment, a laser beam 1 generated from a laser generator 10 is firstly incident to an object thin film 110 mounted on a stage 20 for the first crystallization of the object thin film 110 (operation S100).

Next, by using the reflection mirror 30 positioned on the object thin film 110, the first reflection laser beam 2 reflected by the object thin film 110 is incident to the transflective mirror 60 (operation S200). The reflection angle θ2 of the first reflection laser beam 2 reflected from the object thin film 110 may be smaller than the inclination angle θ3 of the reflection mirror 30. Accordingly, the second reflection laser beam 3 reflected from the reflection mirror 30 is not incident to the object thin film 110, but is incident to the transflective mirror 60.

Next, the transflective mirror 60 is used to secondly reflect the second reflection laser beam 3 reflected by the reflection mirror 30 to the object thin film 110 for the second crystallization of the object thin film 110 (operation S300).

Next, the stage 20 is moved to move the object thin film 110 irradiated with the laser beam 1 (operation S400).

Accordingly, the first crystallization and the second crystallization are repeatedly performed in the same region of the object thin film 110 to form the crystallization region 111 such that the crystallization degree and the productivity of the crystallization may be improved.

The first crystallization region 111a that is firstly crystallized by the transflective mirror 60 and the second crystallization region 111b that is secondly crystallized may be separated. Accordingly, the first crystallization region 111a may be formed at the thin film transistor region requiring the high crystallization uniformity, and the second crystallization region 111b may be formed at a capacitor region or a resistor region where the crystallization uniformity is somewhat low such that the productivity of the laser crystallization process may be improved.

By way of summation and review, a polycrystalline silicon (poly-Si) thin film element may be available for configuring, e.g., a driving circuit that is used for writing an image signal in pixels. For example, the poly-Si may be arranged on a substrate in a pixel thin film transistor (TFT)-array, which may not be suitable to be made with an amorphous silicon TFT. The polycrystalline silicon thin film element, in which connections between a plurality of terminals and a driver IC may be omitted, has high productivity and reliability and results in a smaller panel thickness.

Methods for manufacturing a polycrystalline silicon TFT include a method for manufacturing a polycrystalline silicon TFT in a high temperature condition and a method for manufacturing a polycrystalline silicon TFT in a low temperature condition. In order to form the polycrystalline silicon TFT in a high temperature condition, a high-priced material such as quartz or the like is used as a material for a substrate, so the method for manufacturing a polycrystalline silicon TFT in a high temperature condition may not be suitable for a large size.

Methods for forming polycrystalline silicon at a low temperature include solid phase crystallization (SPC), metal induced crystallization (MIC), metal induced lateral crystallization (MILC), excimer laser annealing (ELA), and the like. However, the excimer laser heat annealing (ELA) has a slow speed and low productivity, and a high maintaining cost, such that it may be difficult for use in forming polycrystalline silicon in a display device of a large size.

Embodiments relate to a laser crystallization apparatus and a method thereof, and to a laser crystallization apparatus crystallizing an amorphous silicon thin film into a polysilicon thin film and a method thereof. In particular, embodiments provide a laser crystallization apparatus with improved productivity and a method thereof.

For example, according to exemplary embodiments, the reflection mirror secondly reflecting the first reflection laser reflected by the object thin film that is firstly crystallized to the object thin film for the second crystallization is installed such that the first crystallization and the second crystallization may be performed for the crystallization region of the object thin film. Accordingly, the crystallization degree may be improved and the tack time of the laser crystallization may be decreased, thereby improving the productivity of the laser crystallization.

While this disclosure has been described in connection with what is presently considered to be practical exemplary embodiments, it is to be understood that the embodiments are not limited to the disclosed embodiments, but, on the contrary, is intended to cover various modifications and equivalent arrangements included within the spirit and scope of the appended claims.

What is claimed is:

1. A laser crystallization apparatus, comprising:
   a laser generator that generates a laser beam;
   a stage mounted with an object substrate with an object thin film to which the laser beam is firstly incident, the stage being relatively movable such that the laser beam scans the object thin film for crystallization; and
   a reflection mirror that secondly reflects a second reflection laser beam to the object thin film from a first reflection laser beam that is reflected from the object thin film to the reflection mirror.

2. The laser crystallization apparatus of claim 1, wherein an assistance incident path through which the first reflection laser beam is incident to the reflection mirror is the same as another assistance reflection path of the second reflection laser beam reflected from the reflection mirror.

3. The laser crystallization apparatus of claim 2, wherein a reflection angle of the first reflection laser beam reflected by the object thin film is the same as an inclination angle of the reflection mirror.

4. The laser crystallization apparatus of claim 3, wherein the inclination angle of the reflection mirror is an inclination angle of a horizontal surface of the reflection mirror with reference to a horizontal surface of the object thin film.

5. The laser crystallization apparatus of claim 1, wherein an assistance incident angle at which the first reflection laser beam is incident to the reflection mirror is larger than zero degrees.

6. The laser crystallization apparatus of claim 5, wherein the assistance incident angle is the same as a reflection angle of the second reflection laser beam reflected by the reflection mirror.

7. The laser crystallization apparatus of claim 6, wherein a reflection angle of the first reflection laser beam reflected by the object thin film is larger than an inclination angle of the reflection mirror.

8. A laser crystallization apparatus, comprising:
   a laser generator that generates a laser beam;
   a stage mounted with an object substrate with an object thin film to which the laser beam is firstly incident, the stage being relatively movable such that the laser beam scans the object thin film for crystallization;
   a reflection mirror that reflects a first reflection laser beam, the first reflection laser beam being reflected by the object thin film; and
   a transflective mirror that secondly reflects a second reflection laser beam reflected by the reflection mirror to the object thin film.

9. The laser crystallization apparatus of claim 8, wherein a reflection angle of the first reflection laser beam reflected by the object thin film is smaller than an inclination angle of the reflection mirror.

10. The laser crystallization apparatus of claim 9, wherein the transflective mirror is positioned along a first incident path through which the laser beam is firstly incident to the object thin film.

11. The laser crystallization apparatus of claim 1, wherein a surface of the reflection mirror has a concave mirror shape.

12. A laser crystallization method, comprising:
   reflecting a laser beam generated by a laser generator to an object thin film mounted on a stage to firstly crystallize the object thin film;
   reflecting a first reflection laser beam reflected by the object thin film back to the object thin film as a second reflection laser beam with a reflection mirror positioned above the object thin film, to secondly crystallize the object thin film; and
   moving the object thin film.

13. The laser crystallization method of claim 12, wherein an assistance incident path through which the first reflection laser beam is incident to the reflection mirror is the same as another assistance reflection path of the second reflection laser beam reflected from the reflection mirror.

14. The laser crystallization method of claim 13, wherein a reflection angle of the first reflection laser beam reflected by the object thin film is the same as an inclination angle of the reflection mirror.

15. The laser crystallization method of claim 14, wherein the inclination angle of the reflection mirror is an inclination angle of a horizontal surface of the reflection mirror with reference to a horizontal surface of the object thin film.

16. The laser crystallization method of claim 12, wherein an assistance incident angle at which the first reflection laser beam is incident to the reflection mirror is larger than zero degrees.

17. The laser crystallization method of claim 16, wherein the assistance incident angle is the same as a reflection angle of the second reflection laser beam reflected by the reflection mirror.

18. The laser crystallization method of claim 17, wherein a reflection angle of the first reflection laser beam reflected by the object thin film is larger than an inclination angle of the reflection mirror.

19. The laser crystallization method of claim 18, wherein a first crystallization region that is firstly crystallized in the object thin film is different from a second crystallization region that is secondly crystallized.

20. The laser crystallization method of claim 19, wherein the first crystallization region is a thin film transistor region and the second crystallization region is a capacitor region or a resistor region.

21. A laser crystallization method, comprising:
   reflecting a laser beam generated from the laser generator to an object thin film mounted on a stage to firstly crystallize the object thin film;
   reflecting a first reflection laser beam reflected by the object thin film to a transflective mirror with a reflection mirror positioned above the object thin film;
   reflecting a second reflection laser beam reflected by the reflection mirror to the object thin film with the transflective mirror to secondly crystallize the object thin film; and
   moving the object thin film.

22. The laser crystallization method of claim 21, wherein a reflection angle of the first reflection laser beam reflected by the object thin film is smaller than an inclination angle of the reflection mirror.

23. The laser crystallization method of claim 22, wherein the transflective mirror is positioned along a first path through which the laser beam is firstly incident to the object thin film.

24. The laser crystallization method of claim 23, wherein a first crystallization region that is firstly crystallized in the object thin film is the same as a second crystallization region that is secondly crystallized.

25. The laser crystallization method of claim 23, wherein a first crystallization region that is firstly crystallized in the object thin film is different from a second crystallization region that is secondly crystallized.

26. The laser crystallization method of claim 25, wherein the first crystallization region is a thin film transistor region and the second crystallization region is a capacitor region or a resistor region.

* * * * *